(12) United States Patent
Elhami Khorasani et al.

(10) Patent No.: US 11,152,454 B2
(45) Date of Patent: Oct. 19, 2021

(54) METHOD OF FORMING A SEMICONDUCTOR DEVICE HAVING A RESISTOR AND STRUCTURE THEREFOR

(71) Applicant: SEMICONDUCTOR COMPONENTS INDUSTRIES, LLC, Phoenix, AZ (US)

(72) Inventors: Arash Elhami Khorasani, Phoenix, AZ (US); Mark Griswold, Gilbert, AZ (US)

(73) Assignee: SEMICONDUCTOR COMPONENTS INDUSTRIES, LLC, Phoenix, AZ (US)

(*) Notice: Subject to any disclaimer, the term of this patent is extended or adjusted under 35 U.S.C. 154(b) by 48 days.

(21) Appl. No.: 16/447,005

(22) Filed: Jun. 20, 2019

(65) Prior Publication Data

US 2020/0266263 A1    Aug. 20, 2020

Related U.S. Application Data

(60) Provisional application No. 62/807,293, filed on Feb. 19, 2019.

(51) Int. Cl.
*H01L 49/02* (2006.01)
*H01L 27/06* (2006.01)

(52) U.S. Cl.
CPC .......... *H01L 28/20* (2013.01); *H01L 27/0629* (2013.01); *H01L 27/0676* (2013.01)

(58) Field of Classification Search
CPC . H01L 28/20; H01L 27/0676; H01L 27/0629; H01L 27/06; H01L 21/822
See application file for complete search history.

(56) References Cited

U.S. PATENT DOCUMENTS

| | | | |
|---|---|---|---|
| 5,550,085 A * | 8/1996 | Liu | H01L 21/76895 257/E21.59 |
| 6,680,515 B1 | 1/2004 | Hsing | |
| 2006/0163691 A1 | 7/2006 | Hall et al. | |
| 2010/0022064 A1 | 1/2010 | Hall et al. | |
| 2011/0068410 A1* | 3/2011 | Garnett | H01L 29/405 257/379 |
| 2012/0154026 A1* | 6/2012 | Karino | G05F 1/462 327/543 |
| 2013/0032862 A1 | 2/2013 | Su et al. | |
| 2013/0032922 A1* | 2/2013 | Kawahara | H01L 21/761 257/492 |
| 2013/0070429 A1* | 3/2013 | Depetro | H01L 29/7818 361/748 |
| 2016/0260704 A1* | 9/2016 | Huo | H01L 27/0629 |
| 2017/0229551 A1* | 8/2017 | Nakanishi | H01L 29/41708 |
| 2018/0269296 A1* | 9/2018 | Weyers | H01L 29/7802 |

* cited by examiner

*Primary Examiner* — Steven H Loke
*Assistant Examiner* — Juanita B Rhodes
(74) *Attorney, Agent, or Firm* — Robert F. Hightower

(57) ABSTRACT

In an embodiment, a semiconductor device includes a resistor that overlies a doped region of the semiconductor device. The resistor is formed into a pattern of a polygon spiral. An embodiment of the pattern of the resistor includes sides and corners. The material of the sides has a low resistivity and the material of the corners has a higher resistivity.

20 Claims, 6 Drawing Sheets

METHOD OF FORMING A SEMICONDUCTOR DEVICE HAVING A RESISTOR AND STRUCTURE THEREFOR

CROSS-REFERENCE TO RELATED APPLICATIONS

This application claims the benefit of U.S. provisional patent application No. 62/807,293, filed on Feb. 19, 2019, the entire contents of which are incorporated herein by reference.

This application is related to patent application Ser. No. 16/446,923, filed on Jun. 20, 2019, entitled "METHOD OF FORMING A SEMICONDUCTOR DEVICE AND STRUCTURE THEREFOR", having a common assignee, and inventors Paul et al. and which is hereby incorporated herein by reference.

BACKGROUND OF THE INVENTION

The present invention relates, in general, to electronics, and more particularly, to semiconductors, structures thereof, and methods of forming semiconductor devices.

In the past, the semiconductor industry utilized various methods and structures to form high-voltage resistors that could be utilized to form a signal that is representative of a received high-voltage. In some applications the high voltage could be in excess of two hundred to fifteen hundred (200 to 1500) volts. In some embodiments, the resistor was formed to overlie portions of a semiconductor device to assist in forming the signal. Examples of some resistors can be found in U.S. Pat. No. 7,306,999 B2 and U.S. Pat. No. 7,955,943 B2 which are both incorporated herein by reference.

In some applications, the resistor had to have a large resistance value which often required forming the underlying semiconductor device to be very large. This often resulted in increased cost.

In some cases, the resistor also may have caused high electric fields. The high electric fields often resulted in reduced performance of the device.

Accordingly, it is desirable to have a resistor that does not increase the size and/or cost of the semiconductor device and/or that reduces electric fields in the semiconductor device.

Figure 1:
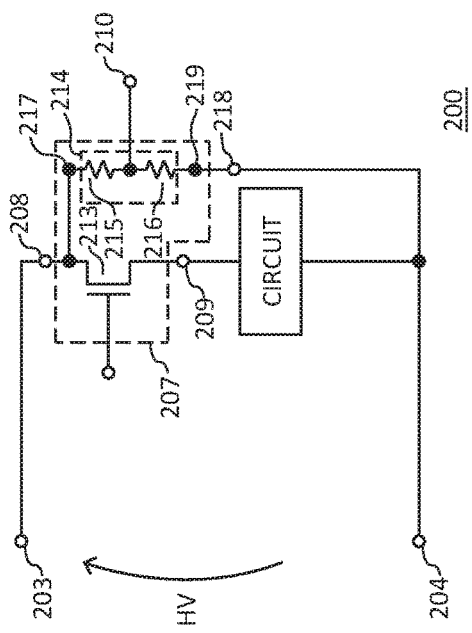
FIG. 1 schematically illustrates an example of a portion of an embodiment of a high-voltage circuit that includes a semiconductor device in accordance with the present invention.

For simplicity and clarity of the illustration(s), elements in the figures are not necessarily to scale, some of the elements may be exaggerated for illustrative purposes, and the same reference numbers in different figures denote the same elements, unless stated otherwise. Additionally, descriptions and details of well-known steps and elements may be omitted for simplicity of the description. As used herein current carrying element or current carrying electrode means an element of a device that carries current through the device such as a source or a drain of an MOS transistor or an emitter or a collector of a bipolar transistor or a cathode or anode of a diode, and a control element or control electrode means an element of the device that controls current through the device such as a gate of an MOS transistor or a base of a bipolar transistor. Additionally, one current carrying element may carry current in one direction through a device, such as carry current entering the device, and a second current carrying element may carry current in an opposite direction through the device, such as carry current leaving the device. Although the devices may be explained herein as certain N-channel or P-channel devices, or certain N-type or P-type doped regions, a person of ordinary skill in the art will appreciate that complementary devices are also possible in accordance with the present invention. One of ordinary skill in the art understands that the conductivity type refers to the mechanism through which conduction occurs such as through conduction of holes or electrons, therefore, that conductivity type does not refer to the doping concentration but the doping type, such as P-type or N-type. It will be appreciated by those skilled in the art that the words during, while, and when as used herein relating to circuit operation are not exact terms that mean an action takes place instantly upon an initiating action but that there may be some small but reasonable delay(s), such as various propagation delays, between the reaction that is initiated by the initial action. Additionally, the term while means that a certain action occurs at least within some portion of a duration of the initiating action. The use of the word approximately or substantially means that a value of an element has a parameter that is expected to be close to a stated value or position. However, as is well known in the art there are always minor variances that prevent the values or positions from being exactly as stated. It is well established in the art that variances of up to at least ten percent (10%) (and up to twenty percent (20%) for some elements including semiconductor doping concentrations) are reasonable variances from the ideal goal of exactly as described. When used in reference to a state of a signal, the term "asserted" means an active state of the signal and the term "negated" means an inactive state of the signal. The actual voltage value or logic state (such as a "1" or a "0") of the signal depends on whether positive or negative logic is used. Thus, asserted can be either a high voltage or a high logic or a low voltage or low logic depending on whether positive or negative logic is used and negated may be either a low voltage or low state or a high voltage or high logic depending on whether positive or negative logic is used. Herein, a positive logic convention is used, but those skilled in the art understand that a negative logic convention could also be used. The terms first, second, third and the like in the claims or/and in the Detailed Description of the Drawings, as used in a portion of a name of an element are used for distinguishing between similar elements and not necessarily for describing a sequence, either temporally, spatially, in ranking or in any other manner. It is to be understood that the terms so used are interchangeable under appropriate circumstances and that the embodiments described herein are capable of operation in other sequences than described or illustrated herein. Reference to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but in some cases it may. Furthermore, the particular features, structures or characteristics may be combined in any suitable manner, as would be apparent to one of ordinary skill in the art, in one or more embodiments. For clarity of the drawings, doped regions of device structures are illustrated as having generally straight line edges and precise angular corners. However, those skilled in the art understand that due to the diffusion and activation of dopants the edges of doped regions generally may not be straight lines and the corners may not be precise angles.

The embodiments illustrated and described hereinafter suitably may have embodiments and/or may be practiced in the absence of any element which is not specifically disclosed herein.

DETAILED DESCRIPTION OF THE DRAWINGS

FIG. 1 schematically illustrates an example of a portion of an embodiment of a high-voltage circuit 200 that includes a semiconductor device 207 having a high-voltage resistor 214. In some embodiments, resistor 214 may function as field plate and may sometimes be referred to as a resistive field plate. Circuit 200 receives a high voltage (HV) between an input terminal 203 and a common return terminal 204. The high voltage (HV) may be either an alternating DC voltage (such as a rectified AC voltage), or a DC voltage, or other type of high-voltage.

Device 207 includes an input terminal 208 that receives the high voltage (HV), and may in some embodiments include a current output terminal 209. Device 207 may also include a reference terminal 218 and an optional signal output 210. Device 207 usually includes an active element, such as for example a transistor 213, and a high-voltage resistor 214. Resistor 214 includes first terminal 217 and a second terminal 219. In an embodiment, high-voltage resistor 214 may be formed as a resistor divider that includes a first resistor element 215 connected in series with a second resistor element 216 and with output 210 formed at a common node between elements 215 and 216. In other embodiments, element 216 and/or output 210 may be omitted and element 215 may be connected between terminals 217 and 219.

Circuit 200 may also include other circuit elements that are connected to device 207 such as for example a circuit connected between terminal 209 and return terminal 204.

Figure 2:
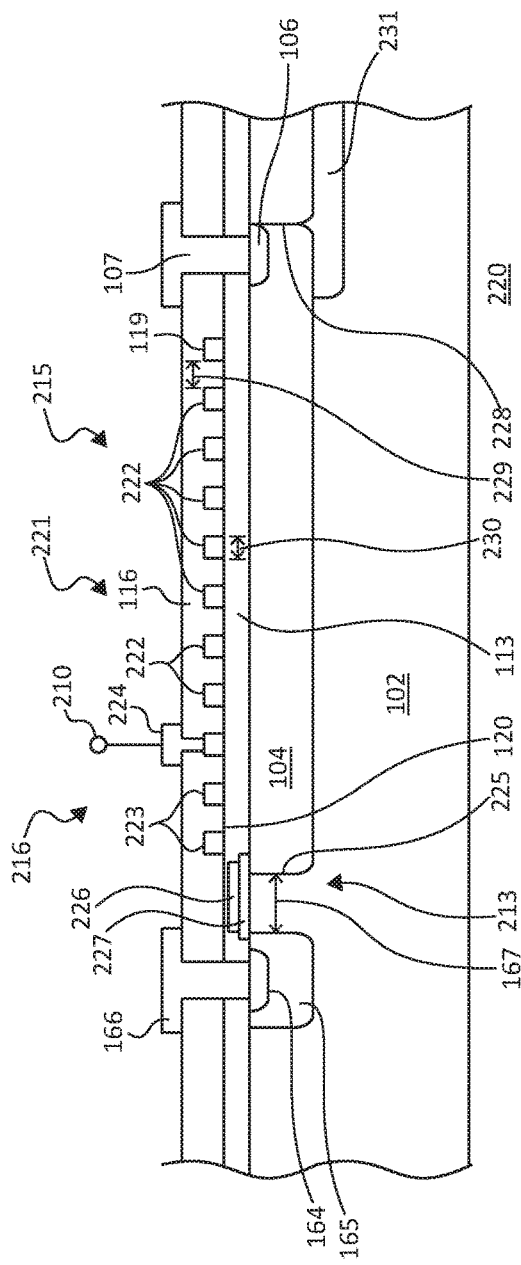
FIG. 2 illustrates an example of an enlarged cross-sectional portion of an embodiment of a semiconductor device that may be an alternate embodiment of the device of FIG. 1 in accordance with the present invention.

FIG. 2 illustrates an example of an enlarged cross-sectional portion of an embodiment of a semiconductor device 220 that may have an embodiment that may be an alternate embodiment of device 207 illustrated in FIG. 1.

Figure 3:
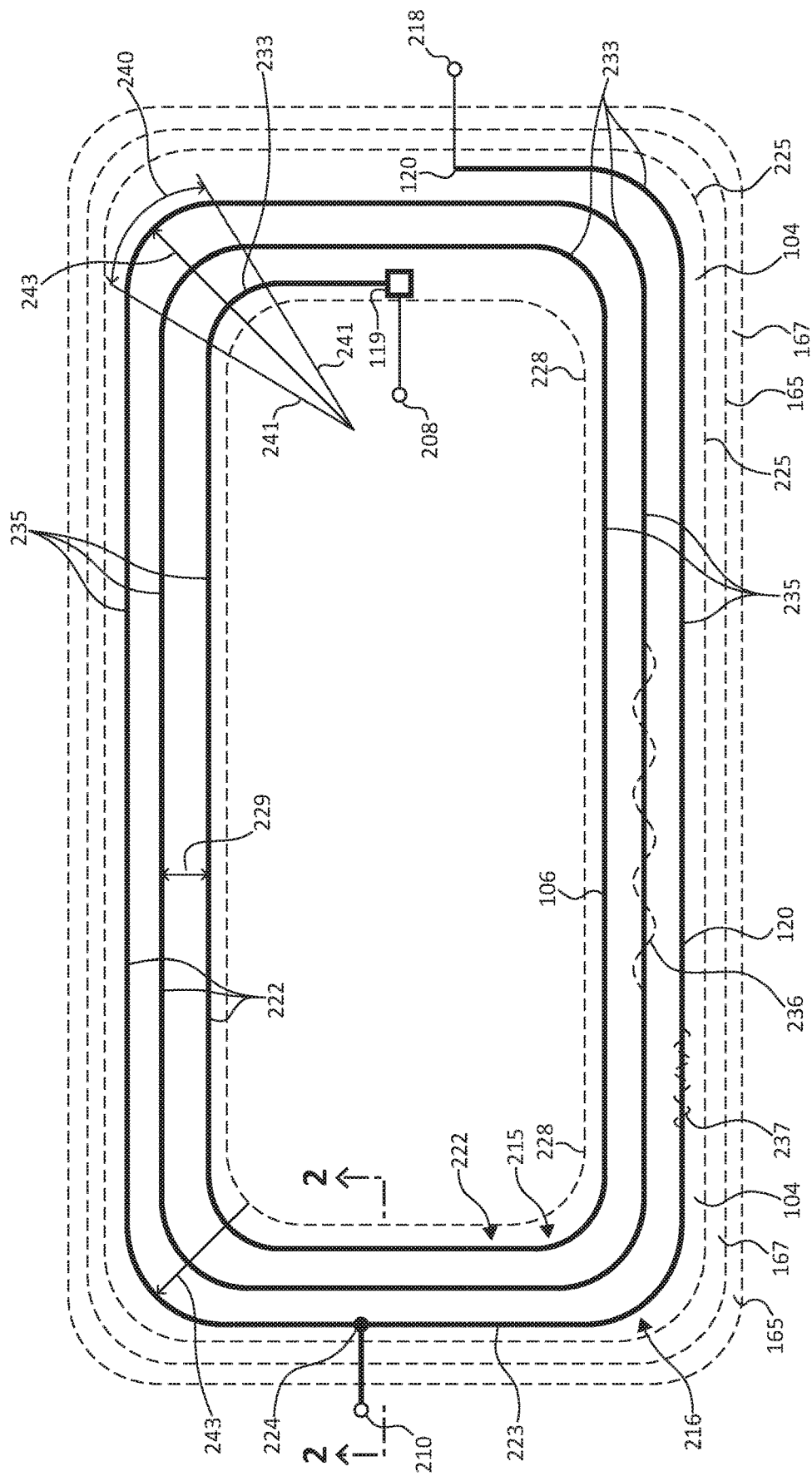
FIG. 3 graphically illustrates an enlarged plan view of portion of an example of an embodiment of a pattern for a portion of the device of FIGS. 1 and/or 2 in accordance with the present invention.

FIG. 3 illustrates an enlarged plan view of a portion of an example of an embodiment of portions of device 220. FIG. 2 is illustrated along a section line 2-2 of FIG. 3. This description has references to FIGS. 1-3.

An embodiment of device 220 may include transistor 213 and a high-voltage resistor 221 that may be an alternate embodiment of resistor 214.

Device 220 is formed on a semiconductor substrate 102 and has a doped region 104 that is formed on substrate 102. For example, region 104 may extend into substrate 102. An embodiment may include that substrate 102 and region 104 are formed with opposite conductivity types. For example, substrate 102 may be P-type semiconductor material and region 104 may be N-type semiconductor material. Device 220 may have an embodiment that includes forming region 104 as a drain of transistor 213. A doped region 106 may be formed on substrate 102 and within region 104 to facilitate forming a low resistance electrical connection to region 104. In an embodiment, region 106 facilitates forming a substantially ohmic contact to region 104. An embodiment of region 106 may be the same conductivity type as region 104 but more heavily doped. For example, region 106 may be heavily doped N-type semiconductor material. Although region 106 is illustrated as one solid region, region 106 may be formed as other shapes including a hollow circular region. In an embodiment, region 106 may be near an interior edge 228 of region 104. A drain conductor 107 is formed on region 106 to function as a drain electrode or drain conductor of transistor 213. An embodiment of device 220 may also include a doped region 231 that electrically isolates the portion of substrate 102 that overlies region 231 from the remainder of substrate 102. An embodiment of region 231 may have a conductivity that is opposite to that of substrate 102. In some embodiments, region 231 may be omitted.

A doped region 165 may be formed on and extending into substrate 102 and spaced apart from region 104. An embodiment of region 165 may form a source region for transistor 213, thus, region 165 may be doped with the same conductivity type as region 104. Some embodiments may include a source contact region 164 that may be formed in region 165 to assist in forming a low resistance or substantially ohmic connection to region 165. A source electrode or conductor 166 may be formed on region 165 to provide an electrical connection to region 165. Region 165 may have an embodiment that completely surrounds the outer periphery of region 104 and spaced apart from region 104. An embodiment of the outer periphery may be along an outer edge 225 of region 104. Outer edge 225 may be distal from interior edge 228.

A gate electrode or gate conductor 226 may be formed overlying a portion of substrate 102 between regions 104 and 165 to form a channel region 167 for transistor 213. A gate insulator 227 may be formed underlying conductor 226, overlying region 167, and interposed between conductor 226 and substrate 102. An insulator 113 typically is formed on the surface of substrate 102 to insulate region 104 and substrate 102 from some other elements of device 220. Those skilled in the art will appreciate that insulator 113 may have one or more layers instead of the single layer illustrated in FIG. 2. Insulator 113 may be silicon dioxide or any other type of well-known insulator or combination of insulators that are used on semiconductor devices.

Resistor 221 is formed overlying insulator 113. An insulator 116 may be formed on or overlying resistor 221 to insulate resistor 221 from some other electrical elements. Insulator 113 electrically isolates resistor 221 and the material thereof from a direct electrical connection to substrate 102, however, resistor 221 may be capacitively coupled to substrate 102. The thickness of insulator 113 is formed to provide such a capacitive coupling. An embodiment of insulator 113 may have a thickness that is less than approximately 0.6 microns, or alternately between approximately 0.1 and approximately 0.6 microns, or alternately approximately 0.3 microns. The material of resistor 221 may be patterned such that portions of resistor 221 are spaced laterally apart from each other forming a distance or space 229 between the portions. For example, the material of resistor 221 may be formed on insulator 113 and patterned including resistor portions 222 and 223 that are formed on insulator 113 and are adjacent to each other. Portions 222 may have an embodiment that may be an alternate embodiment of resistor element 215 and portions 223 may have an embodiment may be an alternate embodiment of resistor element 216. An optional contact 224 may be formed to electrically contact either portion 222 or 223 to form optional signal output 210 that is illustrated in FIG. 1.

Figure 8:
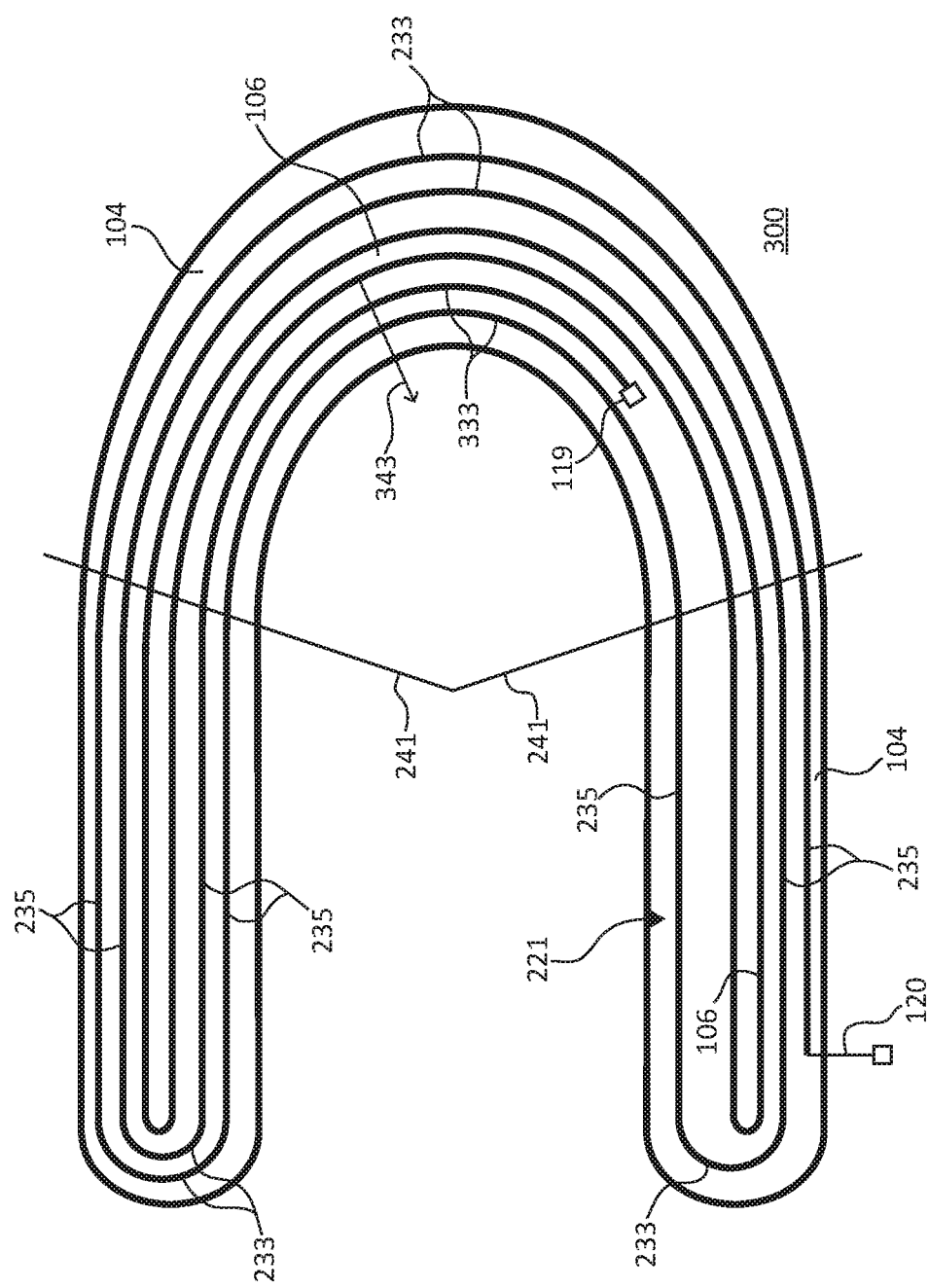
FIG. 8 graphically illustrates an enlarged plan view of an example of a portion of an embodiment of another high-voltage circuit 300 that may be an alternate embodiment of the circuit of FIG. 3 or 4 and includes a semiconductor device in accordance with the present invention.

Region 104 may have an embodiment that may be formed as a polygon. An embodiment may include that the polygon has an opening in the center. Such a shape may be referred to as a "multiply-connected topology" or "multiply-connected" shape meaning a class of connected shape(s) or domain(s) that have an opening or hole through the shape, such as for example a doughnut having a doughnut hole through the middle of the doughnut. The periphery of the multiply-connected shape can be circular or parallelogram or any other shape including an irregular shape. A graphic illustration of an example of a multiply-connected shape is illustrated in FIG. 3. An embodiment of the polygon may be referred to as a race-track shape. Another polygon shape is illustrated in FIG. 8. Some embodiments may include that region 231 may extend to underlie all of the opening in the center between all of edges 228. In some other embodiments, region 104 may extend to underlie all of the opening in the center between what is illustrated as edges 228, and in such an embodiment edges 228 would not exist.

An embodiment of resistor 221 may be formed into a pattern that forms a substantially geometric spiral. The geometric spiral may have an embodiment of a polygon shaped spiral or polygonal spiral or polygon spiral in an embodiment. The material of resistor 221 and portions 222 and 223 extend in an elongated pattern (FIG. 3) from a starting point 119 in a plurality of revolutions around a center 238 of the pattern to form the polygon spiral pattern. In some embodiments, the polygon spiral pattern may be a rectangular spiral as is illustrated in FIG. 3. In other embodiments, the polygon spiral may be another type of polygon spiral such as a square spiral or hexagon spiral or pentagon spiral, etc.

The material of resistor 221 has starting point 119 at an inner portion of the pattern and an ending point 120 that is distal from starting point 119. For example, starting point 119 may begin overlying a portion of region 104 near region 106 or conductor 107. Those skilled in the art will appreciate that starting point 119 may not be the center of the polygon spiral pattern. In an embodiment, starting point 119 may be electrically connected to region 104 such as through a direct connection to either conductor 107 or to region 106. Ending point 120 may have an embodiment that is not directly electrically connected to device 207. For example, not directly connected to region 104 and/or 165. In some embodiments ending point 120 may be in other positions along the elongated pattern as illustrated by point 120 in two different places of FIG. 3. In some embodiments portion 223 and/or the output at terminal 218 may be omitted.

Portions 222 and 223 (or alternately the material thereof) have a width 230 (FIG. 2) and are spaced apart from each other by space 229. An embodiment of space 229 is measured between opposing facing edges of two adjacent revolutions of resistor 221. For example, along a particular line that is substantially perpendicular to the two adjacent revolutions. The elongated pattern means that the material of resistor 221 is formed as a substantially continuous material having a length that is greater than the width, such as for example a substantially continuous line. Even though the material is formed into the polygon spiral, the material still has an elongated shape and that elongated shape is coiled into the polygon spiral. Adjacent revolutions are separated from each other by space 229. In some embodiments, the material of either of or alternately both of portions 222 and 223 may not be continuous. For example, the material of portions 222 may have one material that extends a portion of the distance along portion 222 (for example polysilicon of a certain resistivity) and may have a different material that extends for another distance along portion 222 (for example polysilicon of a different resistivity or a conductor or other material).

In an embodiment, resistor 221 may be formed by patterning a material or plurality of materials on insulator 113. Each revolution of the material of resistor 221 has sides 235 (FIG. 3) that are formed as substantially straight lines and also has resistive vertices or resistive corners or corners 233 that are formed as a curved shape. In an embodiment, each corner 233 is formed as an arc of a circle as illustrated in a general manner by an arrow 240. The arc may have an embodiment that would have a radius 241 of a circle from which the arc was formed. Corners 233 may have other curved shapes in other embodiments. In an embodiment, corners 233 may form an arc of up to approximately ninety (90) degrees. It has been found that the arc formed by corners 233 assists in forming the most stable breakdown voltage if the arc is no less than approximately forty-five (45) degrees and no greater than approximately ninety (90) degrees. In an embodiment, the arcs of all of corners 233 in one revolution sum to approximately three-hundred sixty (360) degrees. Those skilled in the art will appreciate that if there is more than one revolution, the arcs of each revolution sum to approximately three-hundred sixty (360) degrees. If there is less than one complete revolution, the sum may be less than three-hundred sixty (360) degrees. The material used to form corners 233 is different from the material used to form sides 235. Sides 235 are formed from a conductor material that has a low resistance. Sides 235 may be formed from a metal or other conductor such as a low resistance doped polysilicon or salacided polysilicon or silicided polysilicon. The sheet resistance of the material used to form sides 235 generally is less than about thirty (30) ohms per square. However, the material used to form corners 233 usually has a higher resistance than the material of sides 235. Corners 233 may have an embodiment that is formed from polysilicon or doped polysilicon or doped silicon. Thus, the material of sides 235 is different from the material of corners 233 because the resistivity is different. For example, both sides 235 and corners 233 may be formed from some type of polysilicon, however, the resistivity of sides 235 is different from the resistivity of corners 233. The resistivity of the material used for corners 233 is selected to provide the desired resistance for resistor 221 and for portions 222 and 223. In an example embodiment, the material of corners 233 may have a resistivity of approximately three hundred (300) ohms per square or up to approximately five thousand (5000) ohms per square or alternatively between approximately one hundred (100) ohms per square to approximately five thousand (5000) ohms per square or alternately greater than three hundred (300) ohms per square, while the material of sides 235 may have a resistivity of approximately two (2) ohms per square or up to approximately twenty (20) ohms per square or alternatively between approximately two (2) ohms per square to approximately twenty (20) ohms per square or alternately no greater than approximately twenty (20) ohms per square. The resistivity of the material used for corners 233 generally is at least ten (10) times the resistivity of the material used for sides 235 and may be up to or greater than one hundred (100) times the resistivity.

It has been found that under some bias conditions, such as for example substrate 102 having a lower potential than region 106, region 104 may become substantially depleted of carriers and an electric field forms across region 104 with the highest potential being near region 106 and the lowest potential being near outer edge 225. The applied potentials may also form an electric field associated with resistor 221 and that electric field may be coupled to portions of region 104. It has been found that forming sides 235 from a conductor and forming corners 233 from a resistive material assists in reducing the electric field in region 104 which improves the breakdown voltage of device 220. Since resistor 221 is capacitively coupled to region 104, the potential drop along corners 233 assists in forming a more linear electric field distribution in region 104 and assists in improving the breakdown voltage of device 220. In an embodiment, the electric field associated with corners 233 may decrease as a distance 243 (illustrated in general by an arrow) increases along radius 241. An embodiment may include that the electric field decreases as distance 243 increases from the innermost revolution in a particular corner toward the outermost revolution in that same particular corner. In an embodiment, the resistance formed by the material of each revolution within a particular corner 233 increases in a direction from the region that functions as the drain toward a region that functions as the source as long as the distance along an arc of the corner increases for each successive arc in the direction from such drain toward such source. For example, as distance 243 increases from the portion of region 106 that functions as the drain toward region 165 that functions as the source (or toward any other region that functions as the source) the resistance of each corner 233 increases for each successive corner 233. An embodiment may include that the resistance of the material of each revolution within a particular corner 233 increases over the resistance of the corner 233 nearer to the drain proportionally to distance 243. Conversely, if the distance along an arc of the corner decreases for each successive corner in a direction from the drain toward a region that functions as the source, the arc will not be a resistive arc, but may be a conductor arc formed from a conductor material. This configuration of resistances formed by corners 233 forms a potential drop across each corner 233 that more closely matches the potential drop across the underlying electric field in the underlying portion of region 104. Forming these two potentials to more closely match improves the reverse breakdown characteristics of device 220. For example, provides a higher reverse breakdown voltage for a given surface area of device 220. For an embodiment that may be a diode instead of a transistor, the resistance formed by the material of each revolution within a particular corner 233 increases in a direction from the region that functions as the cathode toward a region that functions as the anode as long as the distance along an arc of the corner increases for each successive arc in the direction from such cathode toward such anode.

Although sides 235 are illustrated as substantially straight, sides 235 can be other shapes including a wavy line shape (see dashed line 236) or a saw tooth shape (see dashed line 237) or other shape as long as the resistance of sides 235 is less than that of corners 233.

Additionally, forming sides 235 from a substantially conductor material and corners 233 from a higher resistance material facilitates increasing (or alternately decreasing) the size (for example the surface area) of a device without a substantial decrease (or alternately increase) in the reverse breakdown voltage. In some embodiments, space 229 is substantially constant between each revolution. An embodiment may include that width 230 of the material is substantially constant along the length of the elongated pattern. In some embodiments the width 229 and/or width 230 may change with distance along the length of the elongated pattern.

It has been found that prior devices that use substantially the same material to form the sides and corners results in a decrease in the reverse breakdown voltage when the size increases.

Figure 4:
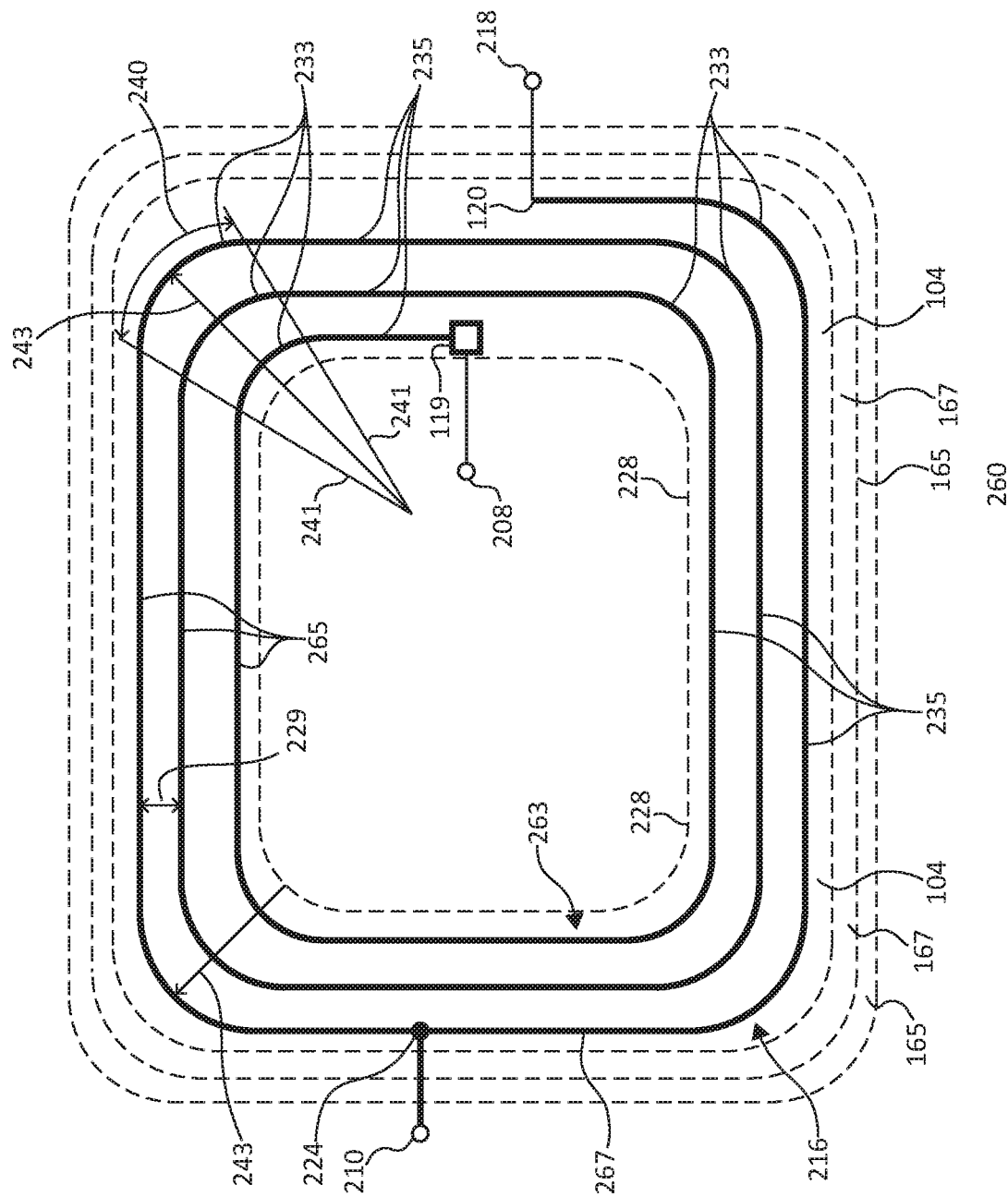
FIG. 4 graphically illustrates an enlarged plan view of an example of a portion of an embodiment of another high-voltage circuit that may be an alternate embodiment of the circuit of FIG. 3 and includes a semiconductor device in accordance with the present invention.

FIG. 4 illustrates an enlarged plan view of a portion of an example of an embodiment of a device 260 that includes a resistor 263. Device 260 is substantially similar to device 220 (FIGS. 2-3) except that device 260 has a smaller surface area than device 220, and has resistor 263 instead of resistor 221. Resistor 263 includes resistor portions 265 and 267 that are similar to respective resistor portions 222 and 223 of device 220. The material of resistor 263 and portions 265 and 267 extend in an elongated pattern from starting point 119 in a plurality of revolutions around center 238 to form the polygon spiral pattern. In some embodiments, the polygon spiral pattern may be substantially a square spiral. Using a conductor material for sides 235 and a higher resistance material for corners 233 allows reducing the size of device 220 (FIG. 3) to the size of device 260 without substantially reducing the reverse breakdown voltage.

Figure 5:
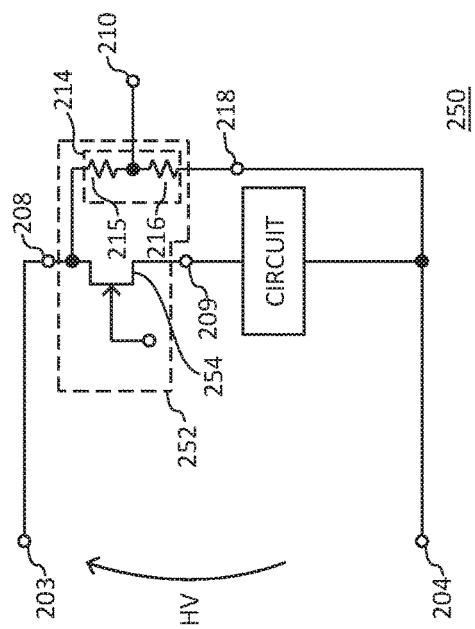
FIG. 5 illustrates an example of an enlarged cross-sectional portion of an embodiment of a semiconductor device that may be an alternate embodiment of the device of FIGS. 1 and 2 or FIG. 4 in accordance with the present invention.

FIG. 5 schematically illustrates an example of a portion of an embodiment of a high-voltage circuit 250 that includes a semiconductor device 252. Device 252 includes resistor 214 and an active element, such as for example a transistor 254. Transistor 254 is an alternate embodiment of transistor 213 (FIG. 2). Transistor 254 is a JFET instead of the MOSFET transistor 213.

Figure 6:
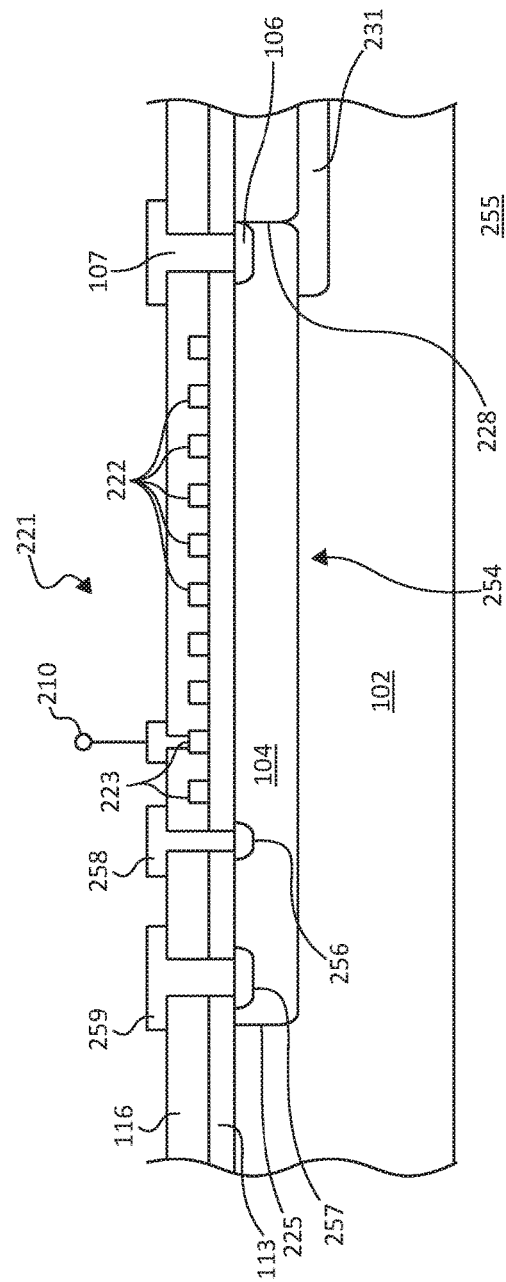
FIG. 6 illustrates an example of an enlarged cross-sectional portion of an embodiment of a semiconductor device that may be an alternate embodiment of the device of FIG. 5 in accordance with the present invention.

FIG. 6 illustrates an example of an enlarged cross-sectional portion of an embodiment of a semiconductor device 255 that may have an embodiment that may be an alternate embodiment of device 252 illustrated in FIG. 5. Device 125 includes resistor 214, or alternatively resistor 221, and transistor 254.

Region 104 near edge 228 forms the drain of transistor 254 and a portion of region 104 near edge 225 forms the source. A doped region 257 may be formed in region 104 to form a low resistance electrical connection to the source region of transistor 254. A conductor 259 may be formed on region 257 to form a source electrode or conductor for transistor 254. In an embodiment, substrate 102 may form the gate electrode of transistor 254. In other embodiments, a gate electrode or conductor material may be formed through insulators 113 and 116 to electrically connect to region 104. For example, device 255 may include a doped region 256 formed on substrate and within region 104 to form a gate of transistor 254. A conductor 258 may be formed on region 256 to form a gate electrode of transistor 255. Resistor 214 still provides the same advantages as explained for device 220.

Figure 7:
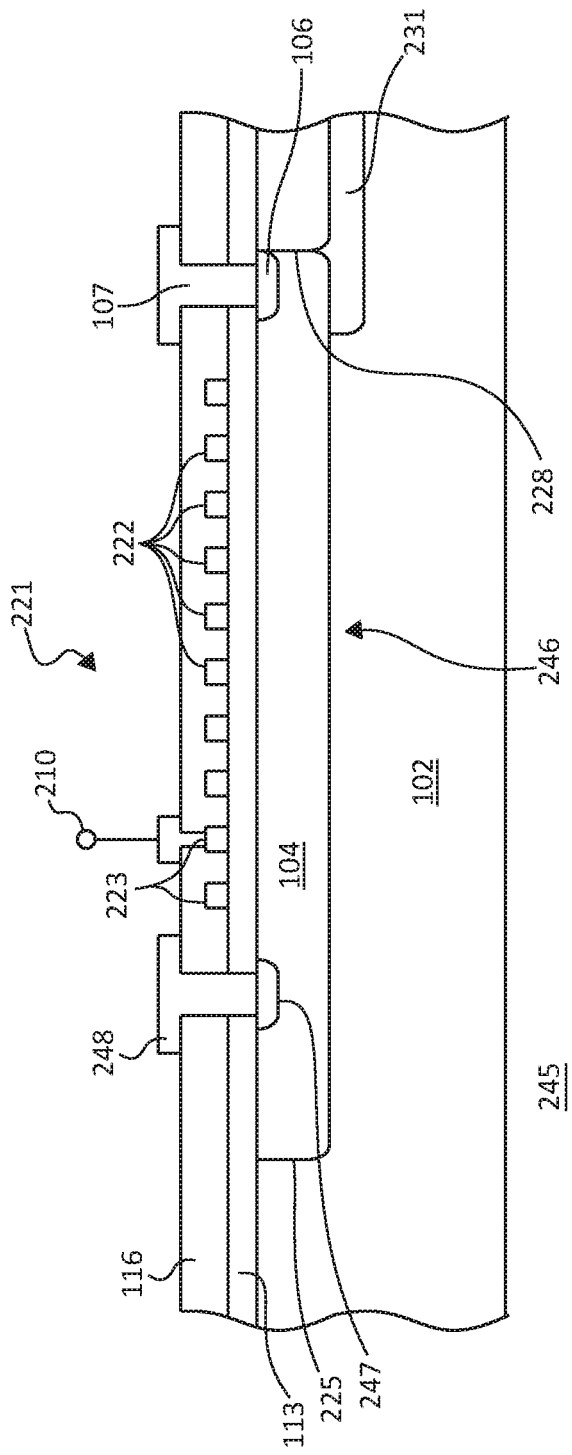
FIG. 7 illustrates an example of an enlarged cross-sectional portion of an embodiment of a semiconductor device that may be an alternate embodiment of the device of FIG. 6 in accordance with the present invention.

FIG. 7 illustrates an example of an enlarged cross-sectional portion of an embodiment of a semiconductor device 245 that includes a diode 246 and resistor 221. Diode 246 includes a doped region 247 formed on the substrate 102 and within region 104. Region 247 has a conductivity type that is the opposite of region 106. An embodiment may include that region 247 has a conductivity type that is opposite to that of region 104. In an embodiment, region 247 may form an anode and region 106 may form a cathode of diode 246. A conductor 248 may be formed to electrically contact region 247 to form an anode electrode of diode 246.

FIG. 8 graphically illustrates an enlarged plan view of an example of a portion of an embodiment of another high-voltage circuit 300 that may be an alternate embodiment of the circuit of FIGS. 3-4 and includes a semiconductor device. Device 300 is substantially similar to device 220 and 260(FIGS. 2-4) except that device 300 has a shape of an open polygon, for example a 'U" shape. The material of resistor 221 extends in an elongated pattern from starting point 119 in a plurality of revolutions around device 300 to form the polygon spiral pattern. Device 300 also includes conductor corners 333 that are formed from a conductor material. The material of corners 333 is a conductor because the distance along the material of each successive corner 333 decreases in a distance 343 from the region that functions as the drain (or alternately cathode) toward the doped region that functions as the source (or alternately anode).

From all the foregoing, one skilled in the art will understand that an example of an embodiment of a semiconductor device having a high voltage resistor element may comprise:

a semiconductor substrate, such as for example substrate 102, having a first conductivity type, for example P-type a first doped region, for example region 104, of a second conductivity type, for example N-type, on a first portion of the semiconductor substrate wherein the first doped region forms a drift region of a transistor with comments such as for example region 213 or 254;

a second doped region, such as for example region 165, of the second conductivity type in the semiconductor substrate and spaced apart from the first doped region wherein the second doped region forms another region, such as for example the source region, of the transistor, such as for example a transistor 213;

an insulator, such as for example insulator 113, overlying the first doped region; and a resistor become such as for example resistor 214 overlying the insulator, the resistor formed in a rectangular spiral shape having a plurality of revolutions, each revolution having sides, such as for example sides 235, and curved corners, such as for example corners 233, that connect the sides, the curved corners formed from a first semiconductor material such as for example polysilicon, having a first resistivity and the sides formed from a second semiconductor material, such as for example a conductor such as doped polysilicon, having a second resistivity wherein the first resistivity is at least one hundred times the second resistivity.

In an embodiment, the second resistivity (235/sides) may be between approximately two ohms per square and twenty ohms per square.

An embodiment may include that the first resistivity may be between approximately three hundred ohms per square and five thousand ohms per square.

Another embodiment may include that the first doped region may be either a drift region of a JFET transistor or a drift region of an MOS transistor or a doped region of a diode.

In an embodiment, the curved corners are arcs of a circle.

An embodiment may also include that the curved corners may be arcs of a circle and a sum total of the arcs is approximately three-hundred sixty degrees.

Those skilled in the art malls were appreciate that any method of forming a resistor of a semiconductor device may comprise:

providing a semiconductor substrate, such as for example substrate 102, having a first conductivity type, such as for example P-type;

forming a first doped region of a second conductivity type, such as for example N-type, on a first portion of the semiconductor substrate;

forming an insulator, such as for example insulator 113, overlying the first doped region; and forming a resistor, such as for example resistor 214 or 221, overlying the insulator and the first doped region including forming the resistor in a polygon spiral shape having a plurality of revolutions with each revolution having sides, such as for example sides 235, and corners, such as for example and corners 233, including forming the corners from a resistive material having a first resistivity and forming the sides from a second material having a lower resistivity.

The method may have an embodiment that may include forming the polygon spiral shape as one of a rectangular spiral, a square spiral, or a hexagonal spiral.

An embodiment of the method may include forming the sides of adjacent revolutions spaced a first distance, such as for example a distance 229, from each other.

In an embodiment may include forming the first distance to be substantially constant for each revolution.

Another embodiment may include forming the sides from the second material that is substantially a conductor.

The method may also have an embodiment that may include forming the first resistivity to be at least approximately three hundred ohms per square.

An embodiment may include forming the lower resistivity to be no greater than approximately twenty ohms per square.

An embodiment that may also include forming the first resistivity to be at least approximately three hundred ohms per square.

Another embodiment may include including forming the resistive material from either polysilicon or doped polysilicon.

In an embodiment, the method may include including forming the second material from a conductor.

An embodiment may include forming the second material from either a silicided polysilicon or a salacided polysilicon.

Those skilled in the art will appreciate that a method of forming a resistor of a semiconductor device may comprise:

providing a semiconductor substrate, such as for example substrate 102, having a first conductivity type, such as for example a P-type;

forming a first doped region of a second conductivity type, such as for example N-type, on a first portion of the semiconductor substrate;

forming an insulator, such as for example insulator 113, overlying the first doped region; and forming a material, such as the material of resistor 221, overlying the insulator and the first doped region including forming the material as an elongated element that is formed in a pattern of a spiral having a plurality of revolutions wherein each revolution has sides, such as for example sides 235, and a corner, such as for example corner 233, that interconnects two of the sides, including forming the corner from a first material having a first resistivity and forming the sides from a second material having a lower resistivity.

An embodiment may include forming the second material from polysilicon having a resistivity that is less than twenty ohms per square.

An embodiment may also include forming the first material from polysilicon having a resistivity that is greater than one hundred ohms per square.

In view of all of the preceding, it is evident that a novel device and method is disclosed. Included, among other features, is forming a resistor in a pattern and with two different materials that forms an electric field that is substantially similar to an electric field in an underlying semiconductor region of the device. The resistor may be formed in a polygon spiral pattern that has sides formed from a conductor material and corners formed from a higher resistance material. The higher resistance material in the corners forms an electric field that more closely matches the electric field in the underlying semiconductor device. Using the two different materials also facilitates changing the size of the device without substantially affecting the reverse breakdown of the device.

While the subject matter of the descriptions is described with specific preferred embodiments and example embodiments, the foregoing drawings and descriptions thereof depict only typical and non-limiting examples of embodiments of the subject matter and are not therefore to be considered to be limiting of its scope, it is evident that many alternatives and variations will be apparent to those skilled in the art. For example, the embodiment of a transistor having a resistor with resistive corners is merely a vehicle to describe any semiconductor device having a resistor that has sides that are formed from a material that is substantially a conductor and at least one corner that is formed from a material that has a greater resistivity.

As the claims hereinafter reflect, inventive aspects may lie in less than all features of a single foregoing disclosed embodiment. Thus, the hereinafter expressed claims are hereby expressly incorporated into this Detailed Description of the Drawings, with each claim standing on its own as a separate embodiment of an invention. Furthermore, while some embodiments described herein include some but not other features included in other embodiments, combinations of features of different embodiments are meant to be within the scope of the invention, and form different embodiments, as would be understood by those skilled in the art.

The invention claimed is:

1. A semiconductor device having a resistor element comprising:
    a semiconductor substrate having a first conductivity type;
    a first doped region of a second conductivity type on a first portion of the semiconductor substrate wherein the first doped region forms a drift region of a transistor;
    a second doped region of the second conductivity type in the semiconductor substrate and spaced apart from the first doped region wherein the second doped region forms another region of the transistor;
    an insulator overlying the first doped region; and
    a resistor overlying the insulator, the resistor formed in a rectangular spiral shape having a plurality of revolutions, each revolution having sides and curved corners that connect the sides, the curved corners formed from a first semiconductor material having a first resistivity and the sides formed from a second semiconductor material having a second resistivity wherein the first resistivity is at least one hundred times greater than the second resistivity.

2. The semiconductor device of claim 1 wherein the second resistivity is between approximately two ohms per square and twenty ohms per square.

3. The semiconductor device of claim 1 wherein the first resistivity is between approximately three hundred ohms per square and five thousand ohms per square.

4. The semiconductor device of claim 1 wherein the first doped region includes either a drift region of a JFET transistor or a drift region of an MOS transistor or a doped region of a diode.

5. The semiconductor device of claim 1 wherein the curved corners are arcs of a circle.

6. The semiconductor device of claim 1 wherein the curved corners are arcs of a circle and a sum total of the arcs is approximately three-hundred sixty degrees.

7. A method of forming a semiconductor device comprising:
    providing a semiconductor substrate having a first conductivity type;
    forming a first doped region of a second conductivity type on a first portion of the semiconductor substrate;
    forming an insulator overlying the first doped region; and
    forming a resistor overlying the insulator and the first doped region including forming the resistor in a polygon spiral shape having a plurality of revolutions with each revolution having sides and corners, including forming the corners from a resistive material having a first resistivity and forming the sides from a first material having a second resistivity that is lower than the first resistivity.

8. The method of claim 7 including forming the polygon spiral shape as one of a rectangular spiral, a square spiral, or a hexagonal spiral.

9. The method of claim 7 including forming the sides of adjacent revolutions spaced a first distance from each other.

10. The method of claim 9 including forming the first distance to be substantially constant for each revolution.

11. The method of claim 7 including forming the sides from the first material that is substantially a conductor.

12. The method of claim 11 including forming the first resistivity to be at least approximately three hundred ohms per square.

13. The method of claim 7 including forming the second resistivity to be no greater than approximately twenty ohms per square.

14. The method of claim 13 including forming the first resistivity to be at least approximately three hundred ohms per square.

15. The method of claim 7 further including forming the resistive material from either polysilicon or doped polysilicon.

16. The method of claim 15 further including forming the first material from a conductor.

17. The method of claim 15 further including forming the first material from either a silicided polysilicon or a salacided polysilicon.

18. A method of forming a semiconductor device having a resistor comprising:
    providing a semiconductor substrate having a first conductivity type;

forming a first doped region of a second conductivity type on a first portion of the semiconductor substrate;

forming an insulator overlying the first doped region; and forming a material overlying the insulator and the first doped region including forming the material as an elongated element that is formed in a pattern of a spiral having a plurality of revolutions wherein each revolution has sides and a corner that interconnects two of the sides, including forming the corner from a first material having a first resistivity and forming the sides from a second material having a second resistivity that is lower than the first resistivity.

19. The method of claim 18 including forming the second material from polysilicon having a resistivity that is less than twenty ohms per square.

20. The method of claim 19 including forming the first material from polysilicon having a resistivity that is greater than one hundred ohms per square.

\* \* \* \* \*